(12) United States Patent
Rondot et al.

(10) Patent No.: US 12,730,131 B2
(45) Date of Patent: Sep. 8, 2026

(54) ELECTRICAL CURRENT MEASUREMENT MODULE

(71) Applicant: Schneider Electric Industries SAS, Rueil Malmaison (FR)

(72) Inventors: Loïc Rondot, Meylan (FR); Juliette Koch, Grenoble (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 87 days.

(21) Appl. No.: 18/428,369

(22) Filed: Jan. 31, 2024

(65) Prior Publication Data

US 2024/0272203 A1 Aug. 15, 2024

(30) Foreign Application Priority Data

Feb. 13, 2023 (FR) ...................................... 2301313

(51) Int. Cl.
*G01R 15/18* (2006.01)
*G01R 19/00* (2006.01)

(52) U.S. Cl.
CPC ......... *G01R 15/18* (2013.01); *G01R 19/0092* (2013.01)

(58) Field of Classification Search
CPC .. G01R 15/18; G01R 19/0092; G01R 15/185; G01R 15/186; G01R 15/181; G01R 19/00; G01R 15/00; G01R 31/00; H01F 1/01
See application file for complete search history.

(56) References Cited

U.S. PATENT DOCUMENTS

| | | | | |
|---|---|---|---|---|
| 6,043,641 | A * | 3/2000 | Singer | G01R 15/181 324/115 |
| 2006/0066292 | A1* | 3/2006 | Tadatsu | G01R 15/185 324/117 H |
| 2010/0301852 | A1* | 12/2010 | Teppan | G01R 15/18 324/253 |
| 2013/0002236 | A1* | 1/2013 | Moliton | H01F 38/36 324/127 |

(Continued)

FOREIGN PATENT DOCUMENTS

| | | |
|---|---|---|
| DE | 20080180 U1 | 1/2003 |
| FR | 2891946 A1 | 4/2007 |

OTHER PUBLICATIONS

French Search Report and Written Opinion dated Aug. 22, 2023 for corresponding French Patent Application No. FR2301313, 6 pages.

*Primary Examiner* — Akm Zakaria
(74) *Attorney, Agent, or Firm* — Wolf, Greenfield & Sacks, P.C.

(57) ABSTRACT

An electrical current measurement module intended to measure an electrical current passing through an electrical conductor. The module includes a main winding of electrically conductive wire, which further includes a ferromagnetic element of dished form, including a rounded central portion and two arms of the same length extending parallel to an axis of symmetry, on either side of the rounded central portion. The main winding extends in a direction at right angles to the axis of symmetry, and is disposed between the arms of the ferromagnetic element, so as to form a through-housing adapted to surround the electrical conductor. The module is configured to be opened into two parts, a first part including at least the main winding and a second part including at least the rounded central portion.

20 Claims, 3 Drawing Sheets

(56) References Cited

U.S. PATENT DOCUMENTS

2013/0076343 A1* 3/2013 Carpenter ................ G01R 1/22
324/252
2016/0266172 A1* 9/2016 Ostrick ................ G01R 15/207
2023/0258693 A1* 8/2023 Rock .................... G01R 15/207
324/126

* cited by examiner

ELECTRICAL CURRENT MEASUREMENT MODULE

CROSS-REFERENCE TO RELATED APPLICATIONS

This application claims priority to and the benefit under 35 U.S.C. § 119(a) of French Application No. 2301313, filed on Feb. 13, 2023.

TECHNICAL FIELD

The present invention relates to an electrical current measurement module.

The invention falls within the field of devices for measuring electrical quantities.

BACKGROUND

Electrical installations, for example local electricity distribution networks, suited to the distribution of electricity in a building, generally comprise several loads, and, if appropriate, several sources, connected by electrical conductors.

There is a need to ensure the supervision, the correct operation and the safety of such electrical installations, and to do this, it is useful to provide electrical quantity measurement means that make it possible to characterise the electrical signals circulating in the electrical conductors, by measurements of electrical quantities.

In particular, the current measurement makes it possible to ensure the safety by making it possible to trigger the actuation of protection devices such as, for example, circuit breakers.

Thus, the implementation of current measurement devices is a recurrent problem in the field of the supervision of electrical installations.

In the field of current measurement devices, in particular for measuring alternating current or current pulses, devices are known that use a helical winding of conductive wire, also called coil, called Rogowski sensors. The winding is preferably of circular form, forming a ring inside which the electrical conductor passed through by the electrical current to be measured is positioned. The voltage induced in the winding is proportional to the rate of change, in other words to the temporal differential, of the current circulating in the conductor. The circular form of the winding, with equidistant turns, exhibits better properties from a theoretical point of view, but is difficult to produce in practice.

In variants, the current sensor is formed from several linear windings, disposed for example in a square and forming a central space for passage of the electrical conductor. However, in such an arrangement it is difficult to guarantee the immunity of the sensor to current sources other than the electrical conductor for which the current is sought to be measured. Conventionally, additional turns are placed in the corners to pick up the flux in the corners.

There are Rogowski sensors that open, comprising windings on a flexible armature, which makes it possible to more easily insert the electrical conductor centrally between the windings of the sensor, without having to disconnect the electrical conductor. That offers the advantage of simplifying and saving time when putting such sensors in place.

However, the sensors of this known type are not very compact, their bulk not allowing them to be integrated in small electrical panels.

There is therefore a need to provide current measurement devices that open, that are powerful and robust, while being easy to manufacture and compact.

SUMMARY

To this end, the invention proposes, according to one aspect, an electrical current measurement module intended to measure an electrical current passing through an electrical conductor, the module comprising a main winding of electrically conductive wire. This module further comprises a ferromagnetic element of dished form, the ferromagnetic element comprising a rounded central portion and two arms of the same length extending on either side of the rounded central portion, the ferromagnetic element having an axis of symmetry parallel to each of the arms, the main winding extending in a direction at right angles to said axis of symmetry, and being disposed between said arms of the ferromagnetic element, so as to form a through-housing adapted to surround said electrical conductor, the measurement module being configured to be opened into two parts, a first part comprising at least the main winding and a second part comprising at least the rounded central portion of the ferromagnetic element, to allow an insertion of said electrical conductor between the two parts.

Advantageously, the electrical current measurement module proposed is compact and robust, by virtue of the arrangement of the main winding and of the associated ferromagnetic element.

The current measurement module according to the invention can have one or more of the following features, taken independently or in all acceptable combinations.

The main winding is produced by winding a conductive wire on a support of linear form.

Each of said arms has an end situated opposite the rounded central portion, and the main winding is disposed at a same distance, in the direction of the axis of symmetry, from the end of each arm.

The first part is formed by the main winding and the second part is formed by the ferromagnetic element.

The rounded central portion of the ferromagnetic element forms said second part, separable from each of said arms, the first part being formed by the arms and the main winding fixed between said arms.

The main winding has a first end and a second end, said arms of the ferromagnetic element being respectively a first arm and a second arm, the measurement module further comprising compensation windings, disposed on either side of the main winding, respectively between the first end of the main winding and the first arm and between the second end of the main winding and the second arm.

The rounded central portion has a rectangular form with rounded corners in a longitudinal plane of the ferromagnetic element.

The rounded central portion has a circular arc form in a longitudinal plane of the ferromagnetic element.

The ferromagnetic element is an alloy of iron-silicon or of iron-nickel.

The module further comprises a processing circuit, the conductive wire of the main winding being connected to the processing circuit, the processing circuit notably comprising an integrator of the electrical signal.

BRIEF DESCRIPTION OF THE DRAWINGS

Other features and advantages of the invention will become apparent from the following description which is given of it hereinbelow, as an indication and in a nonlimiting manner, with reference to the attached figures, in which.

DETAILED DESCRIPTION

Embodiments of an electrical current measurement module are described hereinbelow with reference to FIGS. 1 to 3.

Figure 1:
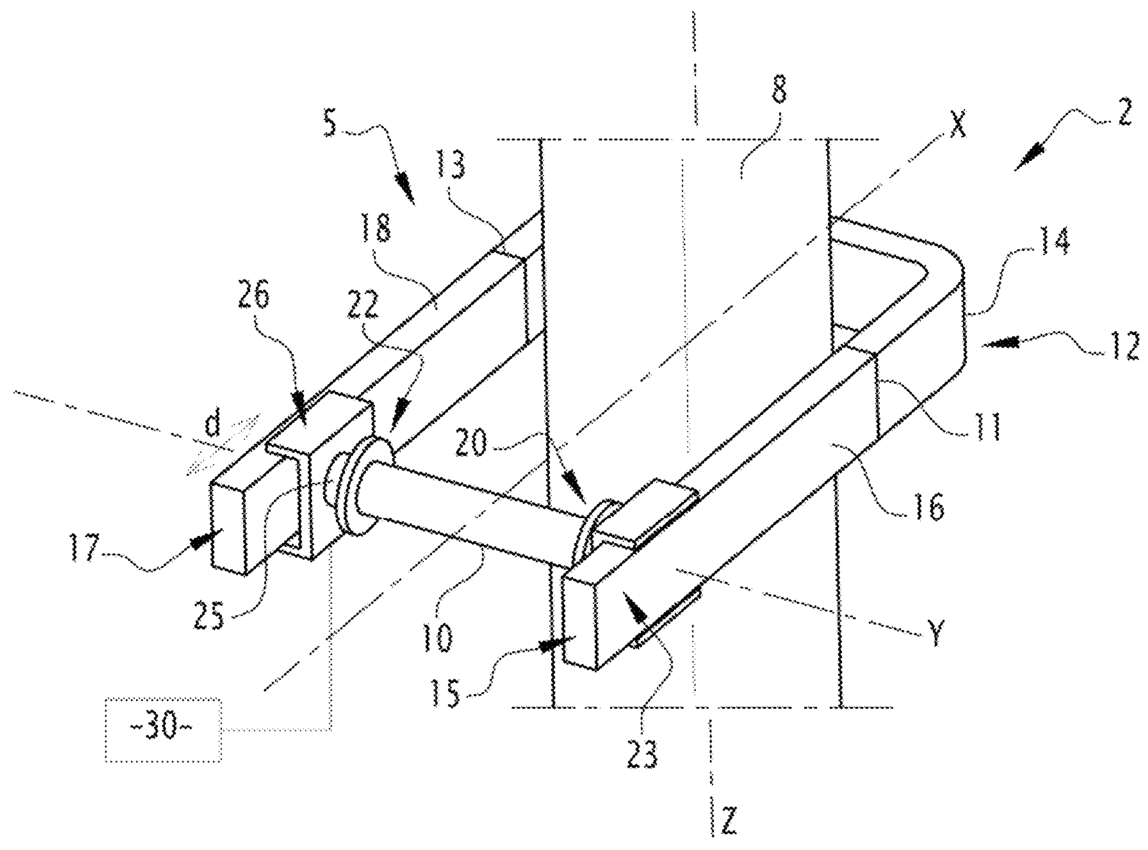
FIG. 1 schematically represents an electrical current measurement module according to an embodiment.

FIG. 1 schematically illustrates a current measurement module 2 according to an embodiment, intended to continuously produce a measurement of the current passing through the electrical conductor 8.

The electrical conductor 8 forms part of an electrical installation (not represented) in which the current measurement module 2 can be positioned to perform the current measurement.

The current measurement module 2 comprises an inductive current sensor 5 comprising a main winding 10 of conductive wire, also called main coil 10, for example of linear form, i.e. produced by the helical winding of the conductive wire around a support of linear form. For example, the support has a circular section.

In a variant, the form of the coil can be dished, for example produced by the helical winding of a conductive wire around a toroidal portion.

The conductive wire is for example a copper wire, the support being made of a plastic material, for example of liquid crystal polymer (or LCP).

The sensor 5 further comprises a ferromagnetic element 12 of dished form.

The sensor 5 that is thus formed is a so-called hybrid Rogowski sensor.

The ferromagnetic element 12 has an inverted "C" form in the figures illustrated, comprising a rounded central portion 14, having an axis of symmetry X, and two arms, respectively a first arm 16 and a second arm 18 extending symmetrically, parallel to the axis of symmetry X of the rounded central portion 12.

Preferably, the two arms 16, 18 are linear and of the same dimensions, e.g. of the same length, thickness, height.

In the example illustrated, the arms 16, 18 have a rectangular section.

Each of the arms 16, 18 has a first end 11, 13 situated facing the rounded central portion and a second end 15, 17, opposite the first end 11, 13.

Figure 2:
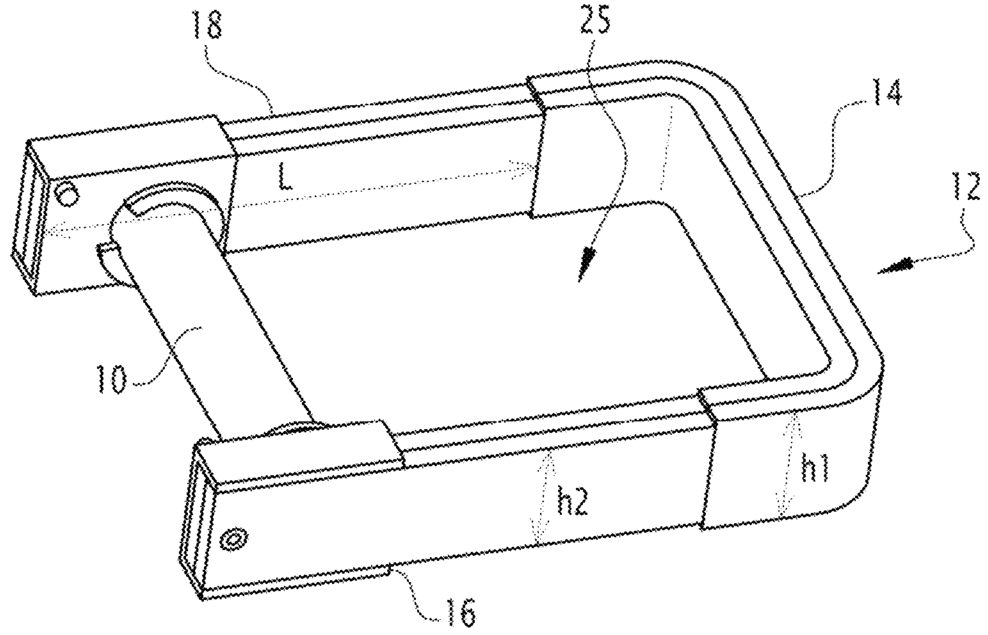
FIG. 2 represents a detail of FIG. 1.

In one embodiment, as can be seen in the detail of FIG. 2, the rounded central portion 14 has a height h1 and each of the arms 16, 18 has a height h2, the height h2 being less than h1.

In a variant, the heights h1 and h2 are equal, or else the height h2 is greater than the height h1.

In one embodiment, the rounded central portion 14 and the arms 16, 18 have a thickness of ferromagnetic material, preferably of between 0.3 mm and 4 mm.

In one embodiment, the ferromagnetic element 12 is produced in the form of a plurality of stacked layers of material.

The ferromagnetic element 12 is for example produced in steel, e.g. an alloy of iron-nickel or iron-silicon, these materials having significant permeability.

In the embodiments illustrated, the main winding 10 is disposed on an axis Y, orthogonal to the axis of symmetry X, in spatial proximity to the two ends 15, 17 of the arms 16, 18.

For example, the main winding 10 is disposed at a same distance d greater than or equal to 1 mm, and preferably greater than or equal to 2 mm, from the second ends 15, 17 of the arms 16, 18.

In one embodiment, the distance d is of the order of magnitude of the diameter of the main winding.

Thus, the arrangement of the main winding and of the ferromagnetic element makes it possible to form a through-housing 25 adapted to accommodate and surround the electrical conductor 8.

Preferably, the ferromagnetic element 12 has a geometrical form that is symmetrical with respect to the axis of symmetry X.

In the embodiment illustrated in FIGS. 1 and 2, the rounded central portion 14 has a rectangular form with rounded corners, in a longitudinal plane of the ferromagnetic element 12 (plane X, Y in FIG. 1).

The sensor 5 of the module 2 is arranged in two parts, so as to allow subsequent opening and closure, and consequently simplify the fitting of the module 2 around the electrical conductor 8.

In the embodiment of FIG. 1, the arms 16, 18 are separable from the rounded central portion 14, which advantageously allows the sensor to be opened by separation between the arms and the rounded central portion, to make it possible to surround an electrical conductor.

In other words, in this embodiment, the sensor 5 is an opening sensor formed in two separable parts, allowing the sensor to be opened and closed around the electrical conductor.

In the embodiment of FIG. 1, the arms 16, 18 and the main winding form a first part of the sensor, the rounded central portion 14 of the ferromagnetic element 12 forming a second part of the sensor.

For example, the arms 16, 18 are fixed onto the support of the main coil by snap-riveting.

A number of mechanical opening modes can be envisaged between the first part and the second part of the sensor, for example by implementing a pivot, or by translation in association with a mechanical closure element (for example by snap-fitting).

The module 2 further comprises embodiments of the compensation windings 20, 22, disposed on either side of the main winding 10, between each end 23, 25 of the main winding 10 and the arms 16, 18 of the ferromagnetic element 62, so as to ensure a magnetic compensation of the mechanical plays, notably between the coil support and the ferromagnetic element.

The compensation windings 20, 22 are preferably symmetrical.

Each compensation winding 20, 22 comprises a same number of turns, this number being for example determined by measurement or simulation of the performance levels of the sensor, so as to optimise performance. For example, disturbing conductors are placed in proximity to the sensor during the simulation, and the number of turns of the compensation windings is that which makes it possible to obtain results that are the least sensitive to the disturbing conductors.

For example, each compensation winding comprises between 80 and 100 turns.

The set of windings, i.e. the main winding 10 and the compensation windings 20, 22, form an electrical current measurement winding or coil.

In one embodiment, the main winding is fixed to the respective arms 16, 18 by means of fixing parts 26, which are, for example, made of plastic material, for example LCP (liquid crystal polymer).

Thus, in this embodiment, the arms 16, 18 and the main winding 10, optionally additionally comprising compensation windings 20, 22, form the first part of the sensor 5, and the rounded central portion 14 forms the second part of the sensor.

Advantageously, the performance levels of the sensor 5 are preserved upon opening and closure, the separation of the two parts being performed on the ferromagnetic element.

The current measurement module 2 further comprises an electrical or electronic processing circuit 30, the current sensor 5 being connected to the processing circuit 30.

The processing circuit 30 is configured to process the electrical current passing through the measurement winding, and notably comprises an integration module to obtain a measurement of the electrical current passing through the electrical conductor 8.

For example, the processing circuit 30 notably comprises an anti-aliasing filter, a digital-analogue conversion block, an electrical signal temporal integration block to obtain a current I(t) measurement and an electrical quantity computation block, for example for calculating average values or root square mean values of the electrical current.

Advantageously, when the ferromagnetic element has a form as illustrated in FIGS. 1 and 2, with a rectangular profile, the current measurement module obtained is particularly compact, and particularly suited to integration in a parallelepipedal housing.

Such a housing is easy to manufacture.

Figure 3:
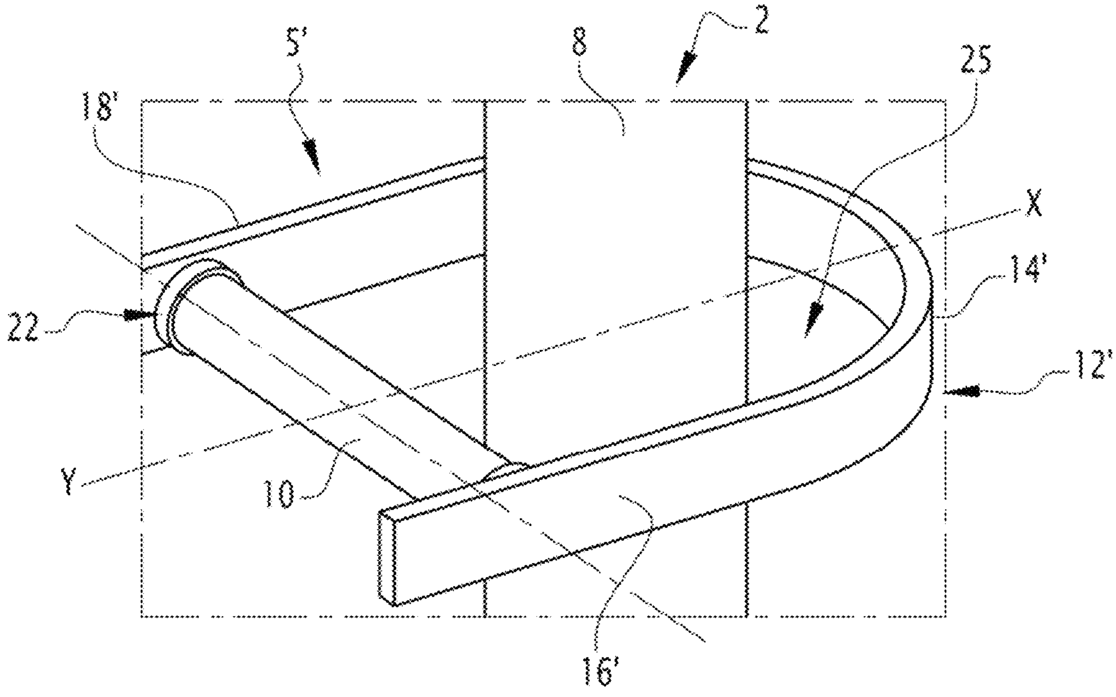
FIG. 3 schematically represents a current sensor of an electrical current measurement module according to a variant.

A second embodiment of the current sensor forming part of a current measurement module 2 is illustrated in FIG. 3.

In this embodiment, the sensor 5' comprises a ferromagnetic element comprising a rounded central portion 14' in circular arc form.

Nevertheless, other forms with symmetry with respect to the axis of symmetry X can be envisaged, for example the rounded central portion 14' has a rectangular form with rounded corners, as illustrated in FIG. 2.

In this second embodiment, the ferromagnetic element 12' is formed in one part, in other words the respective arms 16', 18' are made of a single piece with the rounded central portion 14'.

In this particular case, the opening of the sensor is performed by translational displacement along the axis X of the ferromagnetic element 12' with respect to the main winding 10, if appropriate prolonged by the compensation windings 20, 22. Thus, in this embodiment, the measurement winding 10, 20, 22 forms the first part of the sensor 5', and the ferromagnetic element comprising the rounded central portion 14' and the arms 16', 18' forms the second part of the sensor 5'.

In all the embodiments, the dimensioning of the ferromagnetic element 12 is chosen as a function of the performance levels expected and of the acceptable bulk.

Advantageously, the current sensor 5 of dimensions of approximately 15 mm×15 mm in the plane X, Y makes it possible to obtain performance of the order of 250 mV/Amp at 50 Hz.

Advantageously, the current measurement module is separable into two parts; consequently it is an opening module, which allows easy fitting around an electrical conductor without necessitating disconnecting this conductor.

Advantageously, the separation into two parts does not necessitate an opening of the windings, which renders the current measurement module more robust to a number of openings and closures. Thus, it is easier to handle by an operator.

Advantageously, the dished form of the ferromagnetic element is optimised, which makes it possible to optimise the current measurement performance levels, while observing bulk constraints.

The invention claimed is:

1. A current measurement module intended to measure an electrical current passing through an electrical conductor, the module comprising a main winding of electrically conductive wire, wherein the current measurement module further comprises a ferromagnetic element of dished form, the ferromagnetic element comprising a rounded central portion and two arms of a same length extending on either side of the rounded central portion, the ferromagnetic element having an axis of symmetry parallel to each of the arms, the main winding extending in a direction at right angles to said axis of symmetry, and being disposed between said arms of the ferromagnetic element, so as to form a through-housing adapted to surround said electrical conductor, the current measurement module being configured to be opened into two parts by separating the ferromagnetic element from the main winding, a first part comprising at least the main winding and a second part comprising at least the rounded central portion of the ferromagnetic element, wherein separation of the ferromagnetic element from the main winding allows insertion of said electrical conductor between the two parts.

2. The current measurement module according to claim 1, wherein the main winding is produced by winding a conductive wire on a support of linear form.

3. The current measurement module according to claim 1, wherein each of said arms has an end situated opposite the rounded central portion, and wherein said main winding is disposed at a same distance, in the direction of the axis of symmetry, from the end of each arm.

4. The current measurement module according to claim 1, wherein said first part is formed by the main winding, and said second part is formed by the ferromagnetic element.

5. The current measurement module according to claim 1, wherein said rounded central portion of the ferromagnetic element forms said second part, separable from each of said arms, said first part being formed by the arms and the main winding fixed between said arms.

6. The current measurement module according to claim 1, wherein the main winding has a first end and a second end, said arms of the ferromagnetic element being respectively a first arm and a second arm, the measurement module further comprising compensation windings disposed on either side of the main winding, respectively between the first end of the main winding and the first arm and between the second end of the main winding and the second arm.

7. The current measurement module according to claim 1, wherein the rounded central portion has a rectangular form with rounded corners in a longitudinal plane of the ferromagnetic element.

8. The current measurement module according to claim 1, wherein the rounded central portion has a circular arc form in a longitudinal plane of the ferromagnetic element.

9. The current measurement module according to claim 1, wherein said ferromagnetic element is an alloy of iron-silicon or of iron-nickel.

10. The current measurement module according to claim 1, further comprising a processing circuit, the conductive wire of the main winding being connected to the processing circuit, the processing circuit comprising an integrator of an electrical signal.

11. A current measurement module configured to measure an electrical current passing through an electrical conductor, the module comprising:

a main winding of electrically conductive wire;

a ferromagnetic element of dished form comprising a rounded central portion and two arms of a same length extending on either side of the rounded central portion, the ferromagnetic element having an axis of symmetry parallel to each of the arms;

wherein the main winding extends in a direction at right angles to said axis of symmetry and is disposed between said arms to form a through-housing adapted to surround said electrical conductor; and wherein the current measurement module is configured to be opened by separating the ferromagnetic element from the main winding, wherein separation of the ferromagnetic element from the main winding allows insertion of said electrical conductor in the current measurement module.

12. The current measurement module according to claim 11, wherein the main winding is produced by winding a conductive wire on a support of linear form.

13. The current measurement module according to claim 11, wherein each of said arms has an end situated opposite the rounded central portion, and wherein said main winding is disposed at a same distance, in the direction of the axis of symmetry, from the end of each arm.

14. The current measurement module according to claim 11, wherein the ferromagnetic element is formed in one part with the arms made of a single piece with the rounded central portion.

15. The current measurement module according to claim 11, wherein said rounded central portion of the ferromagnetic element is separable from each of said arms, and wherein the arms and the main winding are fixed between said arms.

16. The current measurement module according to claim 11, wherein the main winding has a first end and a second end, said arms of the ferromagnetic element being respectively a first arm and a second arm, the measurement module further comprising compensation windings disposed on either side of the main winding, respectively between the first end of the main winding and the first arm and between the second end of the main winding and the second arm.

17. The current measurement module according to claim 11, wherein the rounded central portion has a rectangular form with rounded corners in a longitudinal plane of the ferromagnetic element.

18. The current measurement module according to claim 11, wherein the rounded central portion has a circular arc form in a longitudinal plane of the ferromagnetic element.

19. The current measurement module according to claim 11, wherein said ferromagnetic element is an alloy of iron-silicon or of iron-nickel.

20. The current measurement module according to claim 11, further comprising a processing circuit, the conductive wire of the main winding being connected to the processing circuit, the processing circuit comprising an integrator of an electrical signal.

* * * * *